United States Patent [19]

Choi et al.

[11] Patent Number: 5,793,088
[45] Date of Patent: Aug. 11, 1998

[54] STRUCTURE FOR CONTROLLING THRESHOLD VOLTAGE OF MOSFET

[75] Inventors: Jeong Yeol Choi, Fremont; Chung-Jen Chien, Saratoga; Chung Chyung Han, San Jose; Chuen-Der Lien, Los Altos Hills, all of Calif.

[73] Assignee: Integrated Device Technology, Inc., Santa Clara, Calif.

[21] Appl. No.: 664,440

[22] Filed: Jun. 18, 1996

[51] Int. Cl.[6] .................... H01L 29/76; H01L 29/94; H01L 31/062; H01L 31/113
[52] U.S. Cl. .................... 257/408; 257/335
[58] Field of Search .................... 257/335, 336, 257/339, 408

[56] References Cited

U.S. PATENT DOCUMENTS

| | | | |
|---|---|---|---|
| 5,147,811 | 9/1992 | Sakagami | 437/35 |
| 5,395,773 | 3/1995 | Ravindhran et al. | 437/27 |
| 5,405,791 | 4/1995 | Ahmad et al. | 437/34 |
| 5,427,964 | 6/1995 | Kaneshiro et al. | 437/41 |
| 5,449,937 | 9/1995 | Arimura et al. | 257/345 |
| 5,532,508 | 7/1996 | Kaneko et al. | 257/336 |
| 5,650,340 | 7/1997 | Burr et al. | 437/30 |

Primary Examiner—Wael Fahmy
Assistant Examiner—Howard Weiss
Attorney, Agent, or Firm—Skjerven,Morrill, MacPherson,Franklin & Friel

[57] ABSTRACT

A method and structure for controlling the threshold voltage of a MOSFET is provided. The method compensates for the edge effect associated with prior art halo implants by providing an edge threshold voltage implant (the VT implant) which passes impurities through dielectric spacers, through the underlying source/drain regions and into the edges of the halo regions which lie in the channel. The VT implant reduces junction capacitance and does not degrade punch-through voltage.

21 Claims, 8 Drawing Sheets

STRUCTURE FOR CONTROLLING THRESHOLD VOLTAGE OF MOSFET

FIELD OF THE INVENTION

The present invention relates in general to integrated semiconductor devices and more particularly to a method of fabricating metal oxide semiconductor field effect transistors which compensates for the effect on threshold voltage of the edge effect, also known as the reverse short channel effect, and to the resulting structure.

BACKGROUND OF THE INVENTION

As metal oxide semiconductor field effect transistors (MOSFETs) are scaled down to have feature sizes below 0.5 microns (μm), several device characteristics become increasingly important.

One important characteristic is the punchthrough voltage between the source and drain, i.e. the voltage at which conduction between the source and drain occurs when the gate is biased below the threshold voltage. Punchthrough occurs as a result of a drain depletion layer extending from the drain into the channel. The width of the drain depletion layer varies with the source/drain voltage. When the width of the drain depletion layer approaches the spacing between the source and drain (the channel length) then punchthrough occurs. As MOSFET dimensions are scaled down, the channel length is reduced, and punchthrough occurs at lower source/drain voltages.

To increase the punchthrough voltage, the channel is more heavily doped. This reduces the width of the drain depletion layer. In this manner, device dimensions can be reduced while sufficient punchthrough voltages are maintained.

Another important device characteristic is the junction capacitance, i.e. the capacitance between the source and substrate and also between the drain and substrate. The junction capacitance affects the speed of the device, with devices having lower junction capacitance running at higher speeds. It is desirable to reduce the junction capacitance and increase the speed of the device.

One technique for reducing the junction capacitance is to reduce the well dopant concentration. However, as discussed above, it is important to have high well dopant concentrations to maintain sufficient punchthrough voltages. Thus, devices with relatively high well dopant concentrations will have relatively high punchthrough voltages, yet will exhibit higher junction capacitances and will run at slower speeds. Conversely, devices with relatively low well dopant concentrations will have relatively low junction capacitances and higher speeds, yet will have lower punchthrough voltages. Thus, the art needs a method for reducing the junction capacitance which does not reduce the punchthrough voltage.

Another important device characteristic is the threshold voltage, i.e. the voltage applied to the gate at which the channel between the source and drain becomes conductive. As the art moves towards low voltage applications, it is increasingly important to have low threshold voltages.

One technique used to realize lower threshold voltages is to scale down the gate oxide thickness, often below 100 angstroms. However, scaling down the gate oxide reduces the integrity of the gate oxide. Thus a method is needed of lowering threshold voltages without scaling down the gate oxide thickness.

Another technique used to reduce threshold voltage is to decrease the dopant concentration in the channel. However, low channel dopant concentrations result in undesirable punchthrough.

Kaneshiro et al., U.S. Pat. No. 5,427,964 (incorporated herein by reference in its entirety) discloses a method (the halo method) for fabricating insulated gate field effect transistors (IGFETs) with relatively low well dopant concentration. FIGS. 1a to 1d are cross-sectional views of an n-channel IGFET during various fabrication steps in accordance with the method disclosed by Kaneshiro et al.

In FIG. 1a, a structure 6 including a substrate 8 having p-well 10 is illustrated. An optional doped layer 12 of p-conductivity type (p-type) can be formed in p-well 10 by implanting a p-type impurity into P-well 10. The structure further includes an oxide layer 14 overlying doped layer 12. A polysilicon gate 18 is formed overlying a portion of oxide layer 14.

FIG. 1b is a cross-sectional view of structure 6 further along in processing. A p-type impurity is implanted (the halo implant) into p-well 10 to form p-type regions 20, 22 (halo regions 20, 22), which have higher dopant concentrations than p-well 10. Typically, the dopant concentration of halo regions 20, 22 is 5 to 10 times higher than the dopant concentration of p-well 10. As shown, halo regions 20, 22 extend laterally (as a result of lateral impurity spread during the halo implant) from the sides of polysilicon gate 18 to positions below polysilicon gate 18.

An n-conductivity type (n-type) impurity material is implanted into halo regions 20, 22, resulting in the structure shown in FIG. 1c. More particularly, n-type regions 26, 28 (LDD implants 26, 28) are formed in halo regions 20, 22, respectively. The implant energy is set so that the n-type impurity does not pass through polysilicon gate 18 and thus is not implanted into p-type region 12.

FIG. 1d illustrates an enlarged cross-sectional view of structure 6 further along in processing. An additional oxide layer 35 is thermally formed on the tops and sides of polysilicon gate 18 and during this process step oxide layer 14 is also thickened where uncovered by gate 18 (oxide layer 35 is not shown on oxide layer 14). Dielectric spacers 34 and 36 are formed along the portions of oxide layer 35 lining the sides of polysilicon gate 18. By way of example, dielectric spacers are nitride or deposited oxide. An n-type impurity is implanted forming n-type regions 30, 32 within halo regions 20, 22, respectively. The n-type impurity does not pass through polysilicon gate 18 or dielectric spacers 34, 36; thus regions 30 and 32 approximately align with the exposed side edges 34', 36' of dielectric spacers 34, 36, respectively. It should be understood that halo regions 20, 22 extend laterally further under polysilicon gate 18 than n-type regions 26, 28. It should also be understood that the dopant concentrations of n-type region 26 and p-type halo region 20 can be set separately from the dopant concentration of n-type region 30. Similarly, it should also be understood that the dopant concentrations of n-type region 28 and p-type halo region 22 can be set separately from the dopant concentration of n-type region 32. Processing continues to form the desired device.

FIGS. 1a to 1d illustrate the formation of a bilateral IGFET wherein portions of the source and drain (26, 28, 30, 32 in FIG. 1d) are formed within halo regions 20, 22. In a unilateral IGFET, portions of the source region are contained within a halo region whereas portions of the drain region are not formed within a halo region. Referring to FIG. 1b, to form a unilateral IGFET, a mask 15, typically of photoresist material, is formed over a portion of gate 18 and over a portion of p-well 10 adjacent to one side of gate 18. A p-type impurity is implanted to form a single halo region 20. The p-type impurity does not pass through mask 15 and does not form halo region 22. In all other aspects, fabrication is identical to the formation of a bilateral IGFET.

By adjusting the dopant concentration of n-type regions 30, 32, (FIG. 1d) the punchthrough voltage and junction capacitance can be adjusted. However, devices formed using the halo implant method typically have junction capacitances 20 to 200 percent higher than non-halo devices. The higher junction capacitance results from the higher dopant concentration in halo regions 20, 22 as compared to the dopant concentration of p-well 10. As discussed, higher junction capacitances produce slower devices, which is undesirable. However, higher dopant concentrations in halo regions 20, 22 increase the punchthrough voltage, which is desirable.

Another disadvantage in the halo implant method is the edge effect (also known as a reverse short channel effect) which raises the threshold voltage of short-channel devices. The edge effect is attributable to higher p-type doping at the edges of the halo regions than in the middle of the p-type channel region under gate 18, which results in higher threshold voltages. Thus the halo method does not reduce the threshold voltage. It is desirable to have a method of forming devices having high punchthrough voltages, low junction capacitances and low threshold voltages.

SUMMARY OF THE INVENTION

In accordance with this invention, a method and structure for controlling the threshold voltage of a metal oxide semiconductor field effect transistor (MOSFET) is provided.

In the n-channel embodiment, a polycide gate is formed on a semiconductor substrate having a p-well. The structure is subjected to p-type implantation to form p-type halo regions in the p-well, where the p-type impurity does not pass through the polycide gate during the implantation. The structure is then subjected to n-type implantation to form first n-type source/drain regions in the p-type halo regions, where again the n-type impurity does not pass through the polycide gate during implantation. Dielectric spacers are formed along the sides of the polycide gate. The structure is then subjected to a second n-type implantation to form second n-type source/drain regions in portions of the first n-type source/drain regions and in the p-type halo regions, where the dielectric spacers and the polycide gate are not passed through during the implantation.

In accordance with the invention, the structure is then subject to an n-type edge threshold voltage implantation (the VT implant). The n-type impurities do not pass through the polycide gate and do not enter into the underlying p-type channel. The n-type impurities do pass through the second n-type source/drain regions and enter first portions of the halo regions. The n-type impurities reduce the dopant concentrations of the first portions of the halo regions. This decreases the charge buildup between the first portions of the halo regions and the second n-type source/drain regions and hence reduces the junction capacitance of the MOSFET.

The VT implant also passes n-type impurities through the dielectric spacers, through the first n-type source/drain regions underneath the dielectric spacers, and into second portions of the halo regions. The second portions of the halo regions underlie the polycide gate and are located at the edges of the p-type channel. In one embodiment, the n-type impurities lower the p-type dopant concentration of the second portions of the halo regions thereby lowering the threshold voltage of the MOSFET. In an alternative embodiment, the n-type impurities counterdope the second portions to n-type conductivity thereby lowering the threshold voltage of the MOSFET.

Third portions of the halo regions, which underlie the dielectric spacers, are substantially unaffected by the VT implant (the dielectric spacers prevent n-type impurities from entering into the third portions). Thus, the dopant concentrations of the third portions remain approximately equal to the dopant concentration of the halo regions before the VT implant. The relatively high dopant concentrations of the third portions maintain the punchthrough voltage of the MOSFET. Fabrication continues to form the desired device.

In alternative embodiments, similar methods are used to form a p-channel device or to form n-channel and p-channel devices which are used in combination.

In alternative embodiments, a unilateral p-channel or n-channel MOSFET is formed using the methods described above with the exception that only a single n-type or p-type halo region is formed, respectively.

The n-channel and p-channel MOSFETs formed in accordance with the present invention can be used alone or in combination with conventional halo and non-halo p-channel and n-channel MOSFETs, respectively, for example in complementary metal oxide semiconductor (CMOS) devices.

In an alternative embodiment, a CMOS device is formed wherein both the n-channel and p-channel MOSFETS are formed in accordance with the present invention.

In alternative embodiments, the gate is formed of polycrystalline silicon ("polysilicon"). Since polysilicon has a higher permeability to implanted impurities than the dielectric spacers, the thickness of the polysilicon gate must be greater than the thickness of the dielectric spacers. In this manner, the impurities associated with the edge threshold voltage implant pass through the dielectric spacers, yet do not pass through the polysilicon gate.

In accordance with this invention, the VT implant compensates for the edge effect associated with prior art halo methods. The degree of compensation is controlled by adjusting the VT implant energy and dosage. Increasing the VT implant energy and dosage increases the compensation at the edges of the channel and reduces (raises) the threshold voltage of the n-channel (p-channel) device. At a maximum, the threshold voltage for the n-channel (p-channel) device can be reduced (raised) to the threshold voltage associated with the channel region. Conversely, decreasing the VT implant energy and dosage decreases the compensation and raises (reduces) the threshold voltage for n-channel (p-channel) devices. At a maximum, the threshold voltage for the n-channel (p-channel) device can be raised (reduced) to the threshold voltage associated with the device before the VT implant. The VT implant also reduces the junction capacitance of the device while not adversely affecting the punchthrough voltage. Thus, the present invention provides a convenient method of controlling the threshold voltage of a MOSFET while also reducing the junction capacitance and maintaining the punchthrough voltage.

DESCRIPTION OF THE PREFERRED EMBODIMENTS

Several elements shown in the following figures are substantially similar. Therefore, similar reference numbers are used to represent similar elements.

Figure 2:
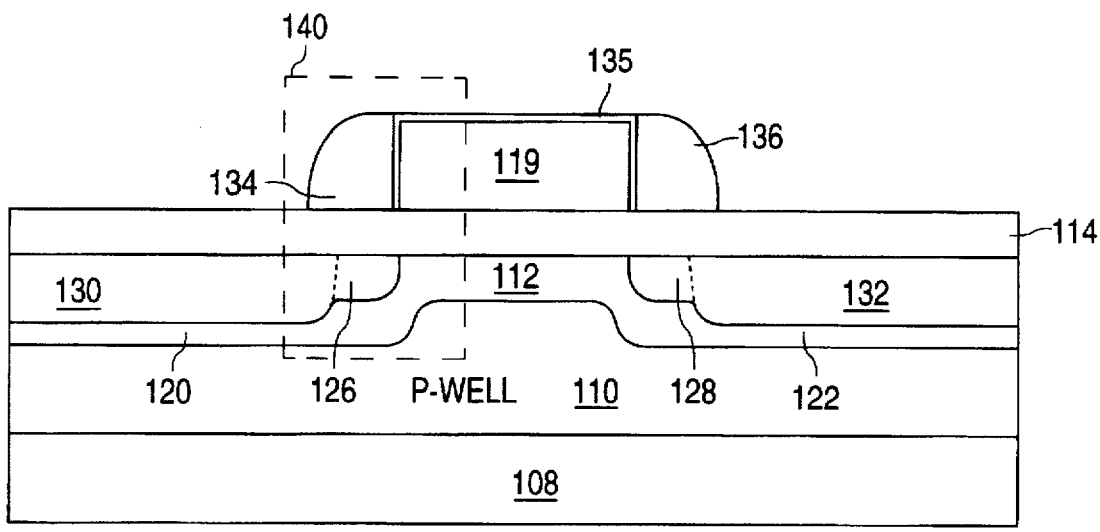
FIG. 2 is a cross-sectional view of a MOSFET before fabrication in accordance with the present invention.

FIG. 2 illustrates an enlarged cross-sectional view of a portion of a metal oxide semiconductor field effect transistor (MOSFET) during fabrication. Techniques for forming structure 106 are conventional and known in the art.

Structure 106 includes a silicon substrate 108 having p-well 110. P-well 110 has formed therein p-type halo regions 120, 122, n-type source/drain regions 126, 128, 130, 132 and p-type channel 112. In particular, n-type source/drain regions 126, 130 and 128, 132 are formed within p-type halo regions 120, 122, respectively. Further, n-type source/drain regions 126, 128 underlie dielectric spacers 134, 136, respectively, and n-type source/drain regions 130, 132 are laterally separated from gate 119 by dielectric spacers 134, 136, i.e. do not underlie gate 119. Optionally, p-well 110 forms the p-type channel and a separately doped p-type channel 112 is not formed. An insulating layer 114, typically oxide, is formed over p-well 110. Dielectric spacers 134 and 136 are formed along the portions of an oxide layer 135 lining the sides of a polycide gate 119. Alternatively dielectric spacers 134 and 136 are formed along the sides of polycide gate 119 and oxide layer 135 is not formed.

Figure 3:
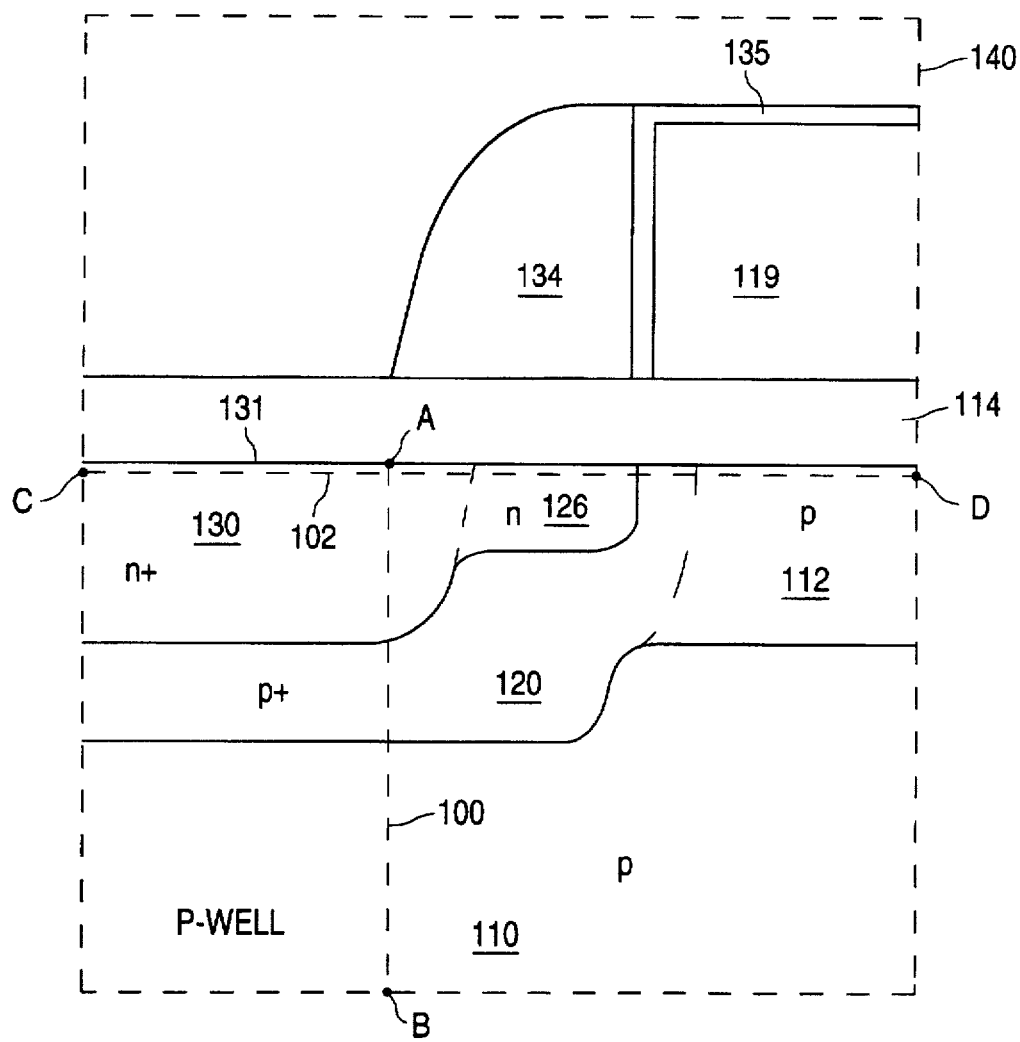
FIG. 3 is an enlarged cross-sectional view of a region of the MOSFET shown in FIG. 2 before fabrication in accordance with the present invention.

FIG. 3 is a blown up cross-sectional view of a region 140 of FIG. 2. As shown in FIG. 3, source/drain region 126 is n-type, source/drain region 130 is n⁺, halo region 120 is p⁺, channel 112 and p-well 110 are p-type (n⁺and p⁺indicate highly doped n-type and p-type regions, respectively). As further shown in FIG. 3, a portion of p⁺halo region 120 extends into p-type channel 112.

Figure 4A:
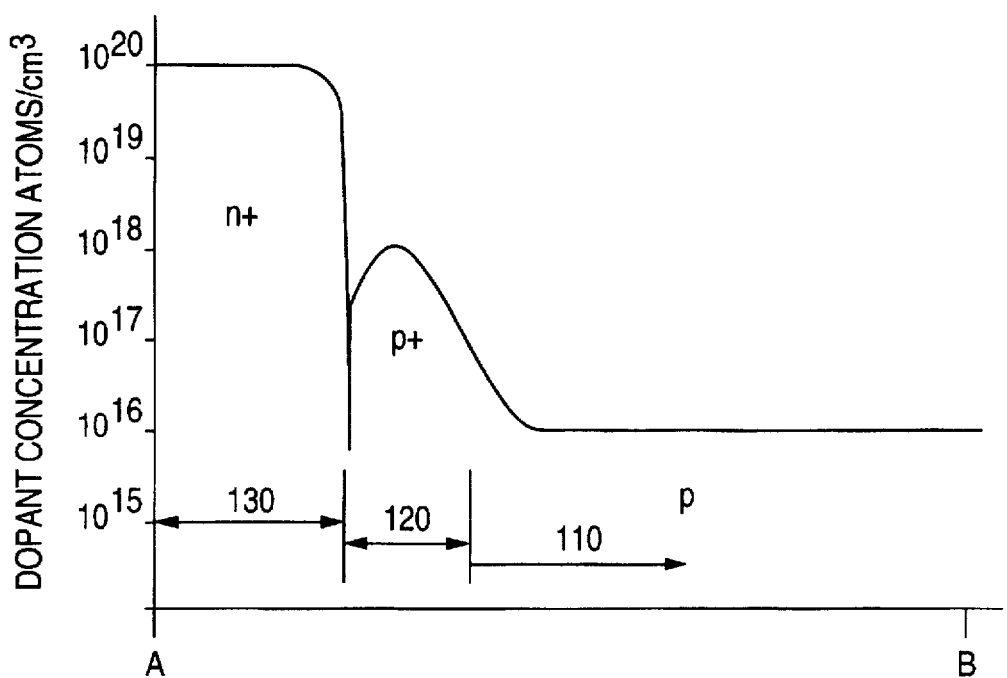
FIGS. 4a and 4b are graphs which illustrate the vertical and lateral dopant concentrations along vertical and lateral lines of FIG. 3, respectively.

FIG. 4a is a graph which illustrates the vertical dopant concentration along line 100 of FIG. 3. As shown in FIG. 4a and beginning at the top surface 131 of the structure shown in FIG. 3, n⁺source/drain region 130 has a relatively high dopant concentration of approximately $1 \times 10^{20}$ atoms/cm³. P⁺halo region 120, just below n⁺source/drain region 130, also has a relatively high dopant concentration of $1 \times 10^{18}$ atoms/cm³ and p-well 110, just below p⁺halo region 120, has a relatively low dopant concentration of approximately $1 \times 10^{16}$ atoms/cm³. Since the p⁺highly doped halo region 120 is located adjacent to the n⁺highly doped source/drain region 130, large charge build-up occurs between the regions. This in turn results in a MOSFET with a high junction capacitance.

Figure 4B:
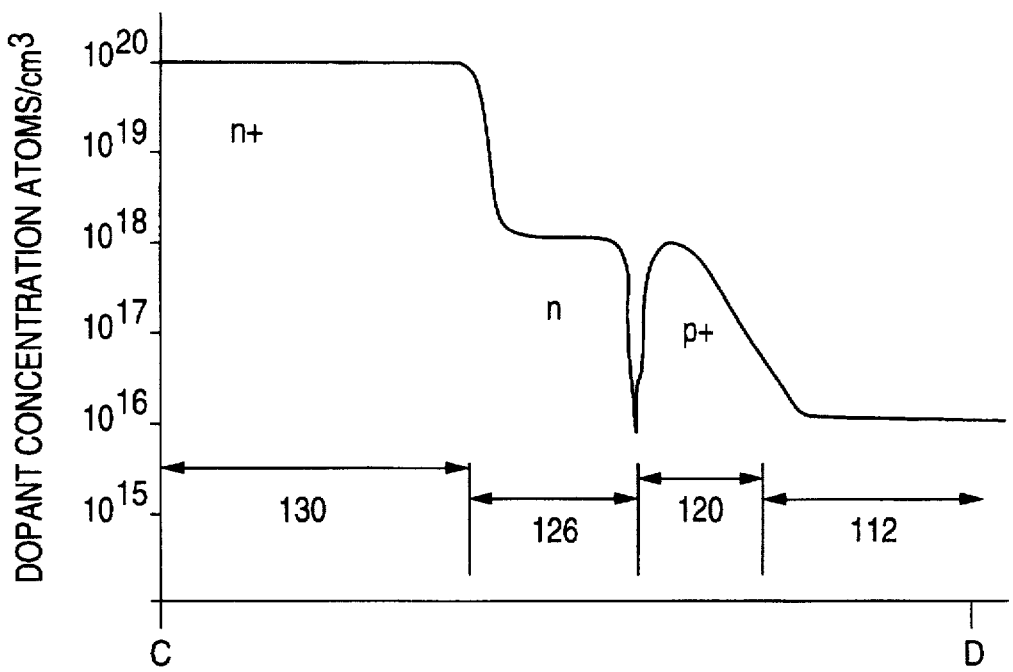

FIG. 4b is a graph which illustrates the lateral doping concentration just below top surface 131 along line 102 of FIG. 3. As shown in FIG. 4b and beginning at the left of line 102 of FIG. 3, n⁺source/drain 130 is again shown as having a relatively high dopant concentration of approximately $1 \times 10^{20}$ atoms/cm³. N-type source/drain region 126, just to the right of n⁺source/drain region 130, has a dopant concentration of approximately $1 \times 10^{18}$ atoms/cm³. P⁺halo region 120, just to the right of n-type source/drain region 126, has a relatively high dopant concentration of approximately $1 \times 10^{18}$ atoms/cm³. P-type channel 112, just to the right of p⁺halo region 120, is lightly doped with a dopant concentration of approximately $1 \times 10^{16}$ atoms/cm³. The relatively high dopant concentration of p⁺halo region 120 in the p-type channel raises the threshold voltage (the edge effect) of the MOSFET (because of the relatively high dopant concentration, higher threshold voltages are required to invert the portion of p⁺halo region 120 located in the p-type channel to become conductive).

Although p⁺halo region 120 adversely affects threshold voltage and junction capacitance, the relatively high dopant concentration of p⁺halo region 120 advantageously increases the punchthrough voltage of the MOSFET.

In accordance with the present invention, structure 106 (FIG. 2) is then subjected to an edge threshold voltage implant (the VT implant) using an n-type impurity, such as phosphorus or arsenic, although any n-type impurity can be used. The VT implant is performed using a high implant energy. Generally, when phosphorus is the impurity used, the VT implant energy is in the range of 50 Kiloelectron volts (KeV) to 200 KeV and typically in the range of 80 KeV to 150 KeV. In particular, in several embodiments the implant energy is 80 KeV, 120 KeV or 150 KeV. The implant dosage of the VT implant is typically in the range of approximately $1 \times 10^{12}$ atoms/cm² to $1 \times 10^{14}$ atoms/cm².

Figure 5:
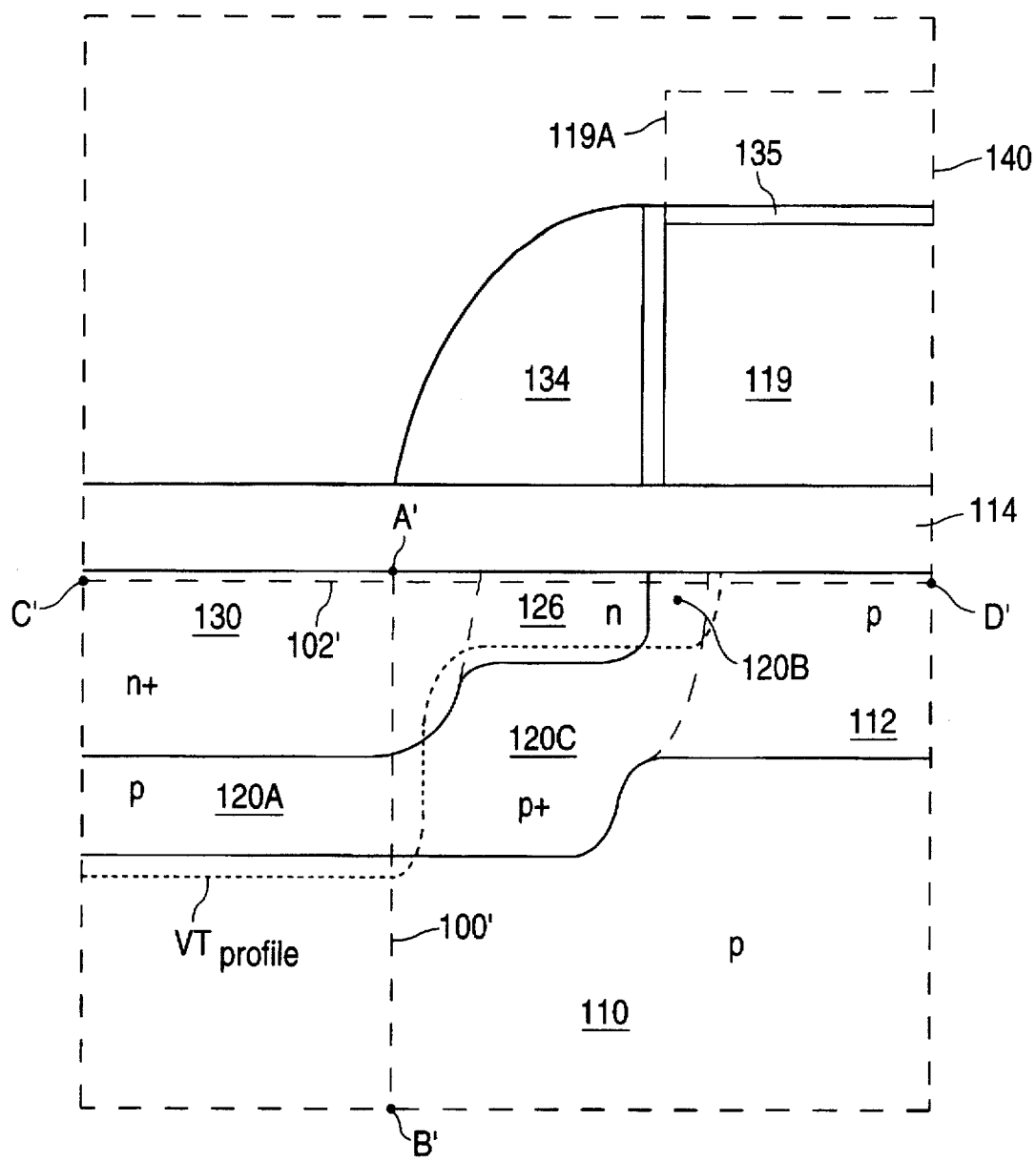
FIG. 5 is an enlarged cross-sectional view of a region of the MOSFET shown in FIG. 2 which illustrates an edge threshold voltage implant in accordance with the present invention.

FIG. 5 is a blown up cross-sectional view of the dashed region 140 from FIG. 2 which illustrates the effects of a VT implant in accordance with the present invention. The VT implant passes n-type impurities through the exposed portion (the portion not covered by dielectric spacer 134 or polycide gate 119) of insulating layer 114, through the underlying n⁺source/drain region 130 and into a portion 120A of p⁺halo region 120. Portion 120A lies under the exposed portion of insulating layer 114, i.e. portion 120A is laterally adjacent to dielectric spacer 134 and laterally separate from polycide gate 119. The n-type impurity reduces the effective p-type dopant concentration of portion 120A. The degree of cancellation of the p-type dopant concentration is controlled by the VT implant energy and dosage, with higher implant energies and dosages decreasing the p-type dopant concentration of portion 120A.

Figure 6A:
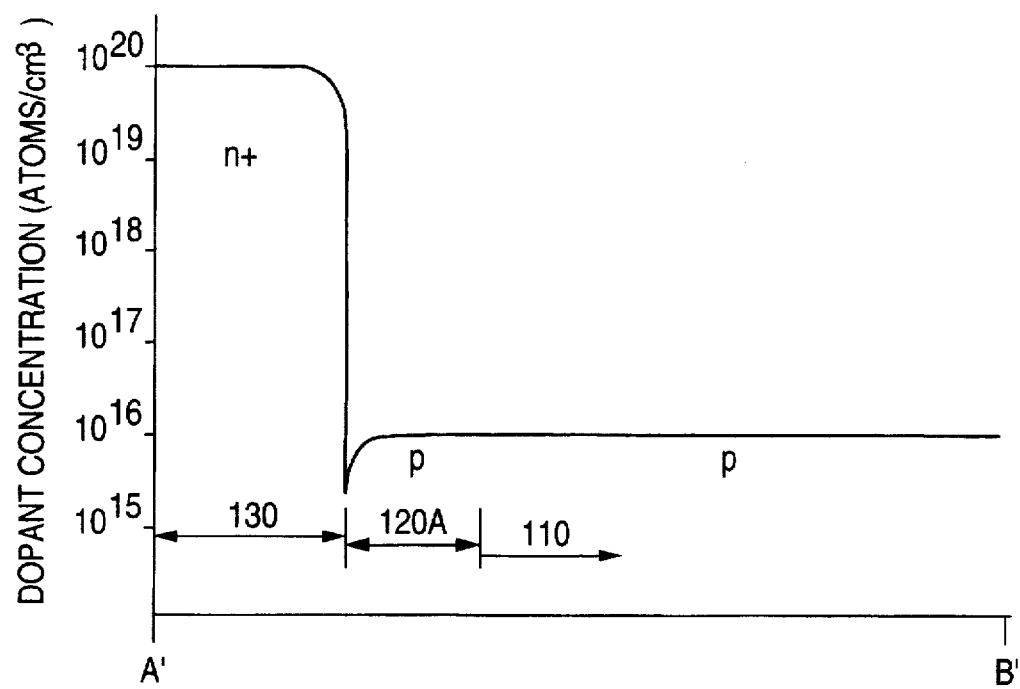
FIGS. 6a and 6b are graphs which illustrate the vertical and lateral dopant concentrations along vertical and lateral lines of FIG. 5, respectively, in accordance with the present invention.

FIG. 6a is a graph which illustrates the vertical dopant concentration along line 100' of FIG. 5. Since the VT implant is performed with a high implant energy, the n-type impurities pass through n⁺source/drain region 130 and as a result the dopant concentration of n⁺source/drain region 130 remains substantially unchanged at approximately $1 \times 10^{20}$ atoms/cm³. However, since the n-type impurities enter into portion 120A, the p-type dopant concentration of portion 120A is reduced to approximately $1 \times 10^{16}$ atoms/cm³. This advantageously reduces any charge build-up between n⁺source/drain region 130 and portion 120A which, in turn, reduces the junction capacitance of the MOSFET.

Referring to FIG. 5, the VT implant is performed with an implant energy sufficient to pass n-type impurities through dielectric spacer 134 and into the underlying substrate. For any given implant energy, the implant depth of the n-type impurities into the underlying substrate is determined by the thickness of dielectric spacer 134. In particular, impurities passing through thicker portions of dielectric spacer 134 (i.e. through portions of dielectric spacer 134 located near polycide gate 119) lose a substantial amount of implant energy and as a result have a shallow implant depth into the underlying substrate. Conversely, impurities passing through thinner portions of dielectric spacer 134 (i.e. through portions of dielectric spacer 134 located away from polycide gate 119) retain a substantial amount of implant energy and as a result are implanted relatively deep into the underlying substrate. Consequently, the profile of the VT implant ($VT_{profile}$) is substantially the same as the profile of dielectric spacer 134, as shown in FIG. 5. ($VT_{profile}$ extends laterally under polycide gate 119 since there is a certain amount of lateral spread associated with ion implantation.)

Figure 6B:
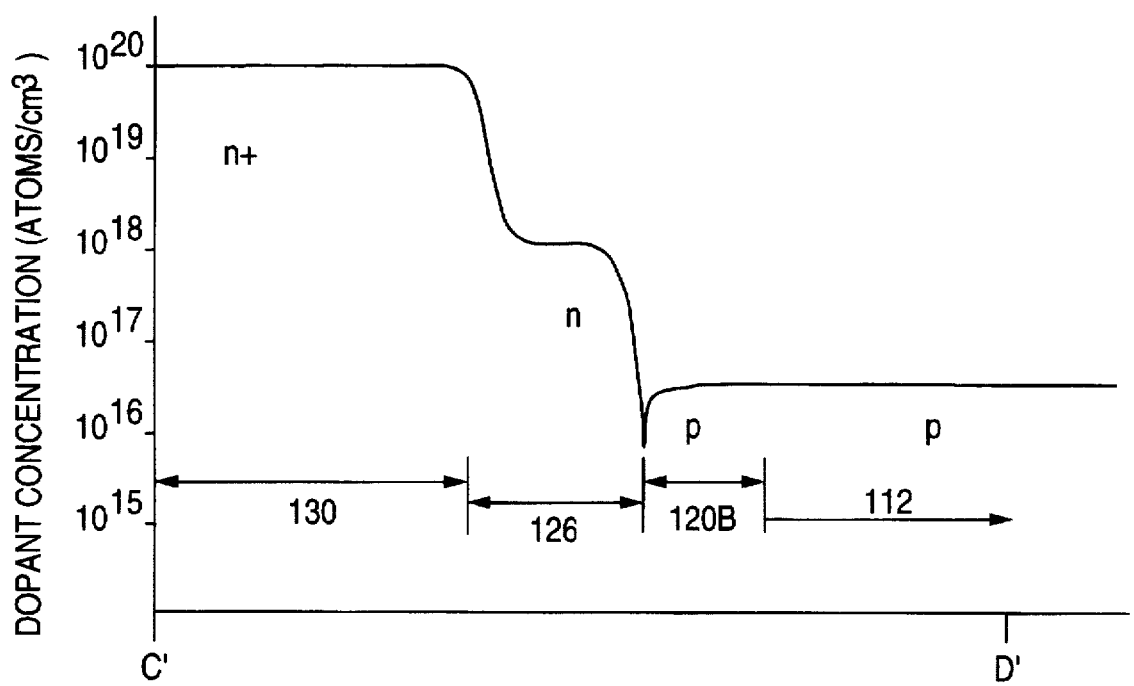

The VT implant introduces n-type impurities into a portion 120B of p-type halo region 120 which lies in p-type channel 112 and under polycide gate 119. FIG. 6b illustrates the lateral dopant concentration along line 102' of FIG. 5 in accordance with one embodiment of the invention. Since the VT implant is performed with a high implant energy, the n-type impurities pass through n⁺source/drain region 130 and n-type source/drain region 126. As a result, the dopant concentrations of n⁺source/drain region 130 and n-type source/drain region 126 remain substantially unchanged at approximately $1 \times 10^{20}$ atoms/cm³ and $1 \times 10^{18}$ atoms/cm³, respectively. However, since the n-type impurities enter into portion 120B, the p-type dopant concentration of portion 120B is reduced to approximately equal the dopant concentration of p-type channel 112 ($1 \times 10^{16}$ atoms/cm³). This advantageously reduces the edge effect and hence the threshold voltage of the MOSFET. Further, since the length of p-type channel 112 remains unchanged, the threshold voltage is reduced without loss of the critical dimension margin of the MOSFET (the length of channel 112 is typically longer than that of an ideal device to account for manufacturing tolerances).

Figure 7:
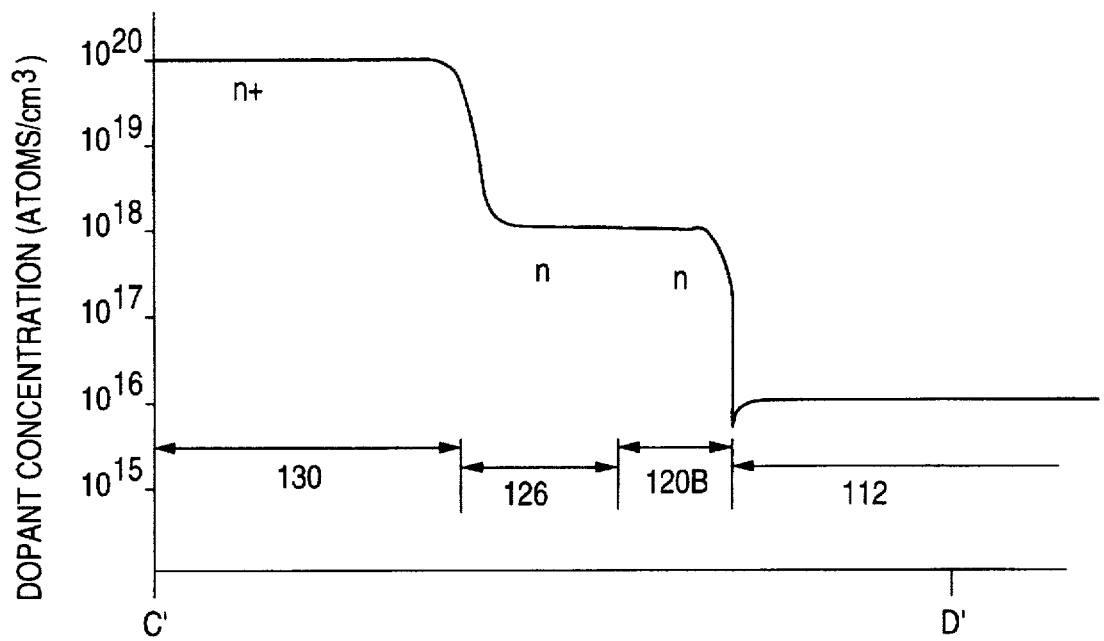
FIG. 7 is a graph which illustrates the lateral dopant concentration along a lateral line of FIG. 5 in accordance with an alternative embodiment of the present invention.

In an alternative embodiment, the VT implant introduces n-type impurities into portion 120B and counterdopes portion 120B to n-type conductivity. FIG. 7 is a graph which illustrates the lateral dopant concentration along line 102' of FIG. 5 wherein portion 120B is counterdoped to n-type conductivity. As shown in FIG. 7, the n-type dopant concentration of portion 120B is approximately equal to the dopant concentration of n-type source/drain region 126 of $1 \times 10^{18}$ atoms/cm³. By counterdoping portion 120B to n-type conductivity, the length of channel 112 is reduced. This reduces the threshold voltage of the MOSFET.

In accordance with the invention, a portion 120C (FIG. 5) of halo region 120 is substantially unaffected by the VT implant. Portion 120C underlies dielectric spacer 134 which prevents impurities from entering into portion 120C. Thus the dopant concentration of portion 120C is approximately equal to the dopant concentration of halo region 120 before the VT implant. The relatively high p-type dopant concentration of portion 120C maintains the punchthrough voltage of the device. Thus, junction capacitances and threshold voltages are reduced, while punchthrough voltages are maintained.

In one embodiment, the VT implant does not pass n-type impurities through polycide gate 119 and into p-type channel 112. However, in alternative embodiments, the VT implant is performed with an implant energy sufficient to pass n-type impurities through polycide gate 119 and into the underlying p-type channel 112, for example to adjust the threshold voltage.

In all of the embodiments, fabrication continues using conventional methods to form the desired device.

FIGS. 5, 6a, 6b, and 7 show regions which have had implanted in them impurity ions which have passed through dielectric spacer through n-type source/drain regions 126, 130, and into portions of halo region 120. It should be understood that the VT implant simultaneously passes impurity ions through dielectric spacer 136 (see FIG. 2), through n-type source/drain regions 128, 132, and into portions of halo region 122. As those skilled in the art will understand, the descriptions and illustrations in reference to the VT implant through dielectric spacer 134 are equally applicable to the VT implant through dielectric spacer 136.

In the embodiment described thus far, only an n-channel device receives the halo implant and the VT implant in accordance with the present invention. However, in alternative embodiments, similar methods are used to form a p-channel device, or to form n-channel and p-channel devices which are used in combination.

Figure 8:
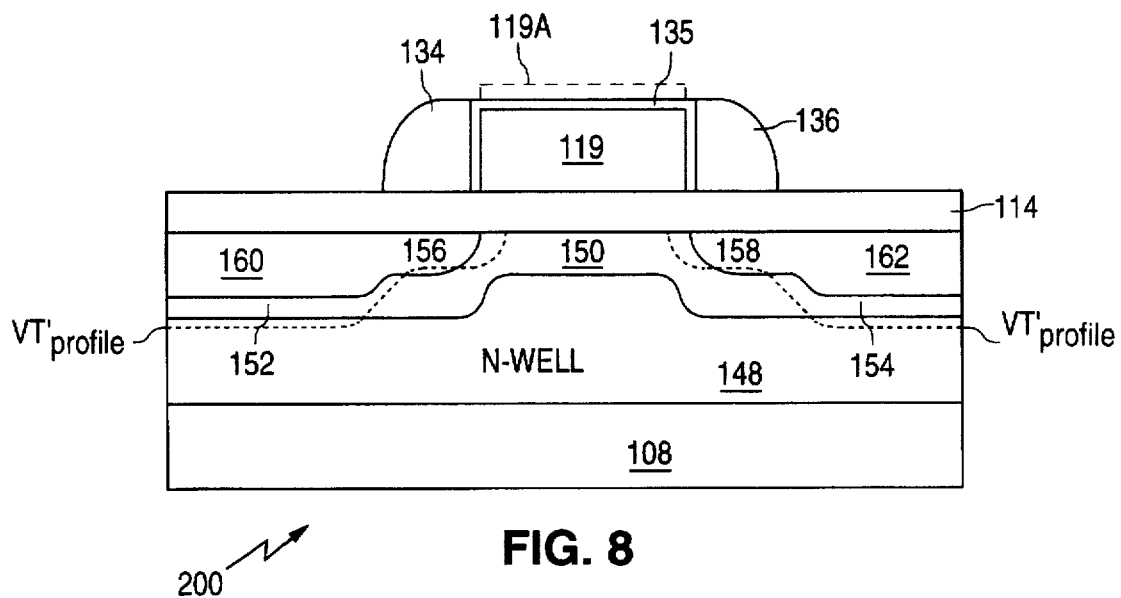
FIG. 8 is a cross-sectional view of a p-channel device formed in accordance with an alternative embodiment of the present invention.

FIG. 8 illustrates the formation of a p-channel device in accordance with an alternative embodiment of the present invention. An n-well 148 is formed in substrate 108. Formed using conventional methods within n-well 148 are n-type halo regions 152, 154, n-type channel 150 (separately doping n-type channel 150 is optional) and p-type source/drain regions 156, 158, 160 and 162.

In accordance with the present invention, the structure 200 is subjected to a p-type VT implant, for example using boron or boron flouride ions ($BF_2$), although other p-type impurities can be used. The VT implant passes p-type impurities through dielectric spacers 134, 136, through insulating layer 114, through source/drain regions 156, 158, 160, and 162 and into portions of n-type halo regions 152, 154. However, the VT implant does not pass impurities through polycide gate 119 and into portions of n-type channel 150. The profile of the VT implant is shown as $VT_{profile}$. Fabrication continues using conventional methods to form the desired device.

The VT implant in accordance with this invention compensates for the undesirable edge effect associated with conventional halo implants, i.e. compensates for the high dopant concentrations of the portions (see 120B in FIG. 5 for example) of the halo regions located at the edges of the channels. By adjusting the VT implant energy, the dopant concentration at the channel edges can be controlled (see 120B in FIGS. 6b and 7 for example). Since the threshold voltage is directly related to the dopant concentration at the channel edges, the VT implant provides a convenient means of adjusting and lowering the threshold voltage for n-channel devices and adjusting and raising (making the threshold voltage less negative) the threshold voltage for p-channel devices. In particular, increasing the VT implant energy and dosage increases the compensation at the edges of the channel and reduces (raises) the threshold voltage of the n-channel (p-channel) device. At a maximum, the threshold voltage for the n-channel (p-channel) device can be reduced (raised) to the threshold voltage associated with the channel region. Conversely, decreasing the VT implant energy and dosage decreases the compensation and raises (reduces) the threshold voltage for n-channel (p-channel) devices. At a maximum, the threshold voltage for the n-channel (p-channel) device can be raised (reduced) to the threshold voltage associated with the device before the VT implant. Furthermore, since the VT implant has little to no effect on the dopant concentrations of the portions (see 120C in FIG. 5 for example) of the halo regions that control punchthrough voltage, punchthrough voltage is maintained. The VT implant also reduces the junction capacitance by lowering the dopant concentration of the portions (see 120A in FIG. 5, for example) of the halo regions adjacent to the highly doped source/drain regions.

The n-channel and p-channel devices formed in accordance with the present invention can be used alone or in combination with conventional halo and non-halo p-channel and n-channel devices, respectively, for example in complementary metal oxide semiconductor (CMOS) devices. Furthermore, CMOS devices can be formed using n-channel and p-channel devices, both of which are formed according to the present invention.

Figure 9A:
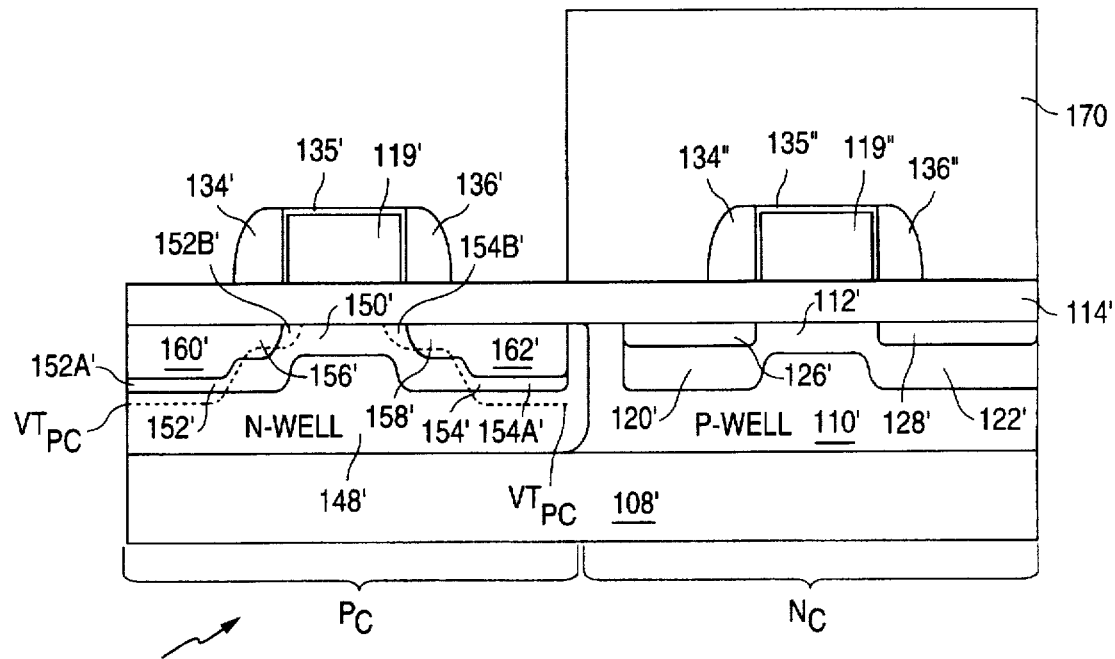
FIGS. 9a and 9b are cross-sectional views of a complementary metal oxide semiconductor (CMOS) device in which both the n-channel and p-channel MOSFETS are fabricated in accordance with the present invention.
Figure 9B:
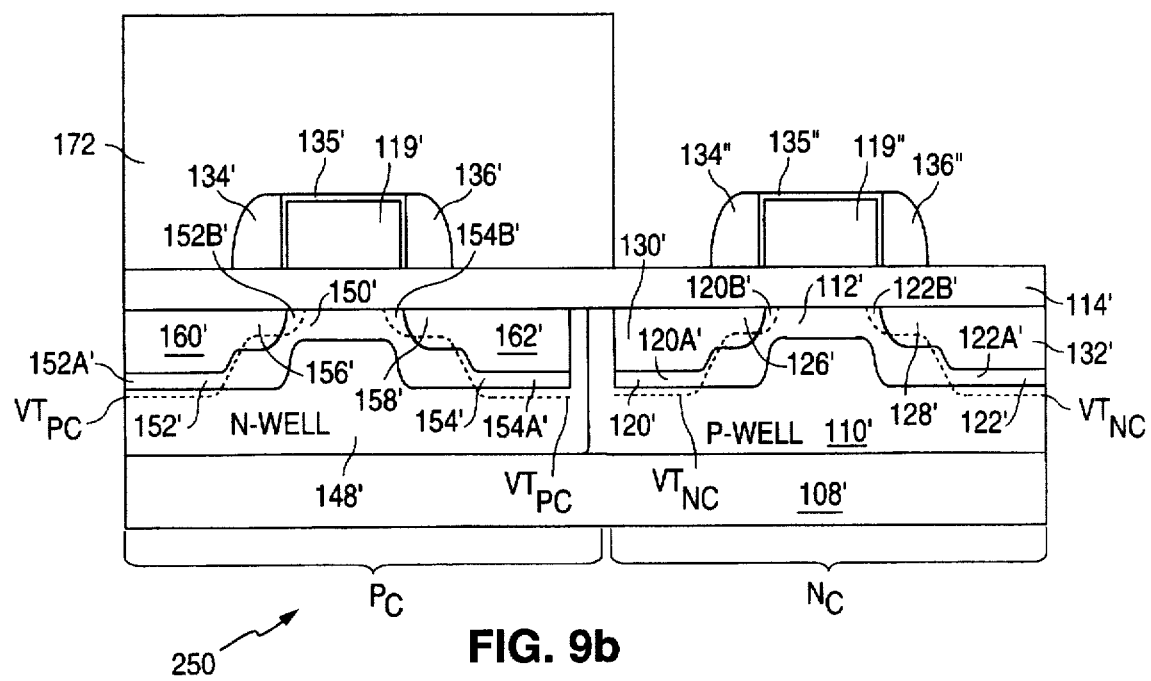

FIGS. 9a and 9b illustrate n-channel and p-channel devices, $N_C$ and $P_C$, formed in combination in accordance with an alternative embodiment of the present invention. P-channel device $P_C$ is formed using conventional methods and includes an n-well 148' formed within a substrate 108'. N-type halo regions 152', 154' and n-type channel 150' are formed within n-well 148' (separately doping n-type channel 150' is optional). P-type source/drain regions 156', 160' and 158', 162' are formed within n-type halo regions 152' and 154', respectively.

N-channel device NC is formed using conventional methods and includes a p-well 110' formed within the substrate 108'. P-type halo regions 120', 122' and p-type channel 112' are formed within p-well 110' (separately doping p-type channel 112' is optional). N-type source/drain regions 126' and 128' are formed within p-type halo regions 120' and 122', respectively.

An insulating layer 114' overlies n-well 148' and p-well 110'. Polycide gates 119' and 119" overlie n-well 148' and p-well 110', respectively. Oxide layers 135', 135" are formed over polycide gates 119', 119", respectively. Dielectric spacers 134', 134' and 134", 136" adjoin the portions of oxide layers 135', 135" lining the sides of polycide gates 119', 119", respectively. A mask 170, such as a photoresist mask, is formed over p-well 110', as shown.

In accordance with the invention, the structure 250 is subjected to a p-type VT implant. The VT implant passes impurity ions through dielectric spacers 134', 134' through insulating layer 114', through p-type source/drain regions 156', 158', 160' and 162' and into portions of n-type halo regions 152', 154'. In particular, the VT implant passes impurities into first portion 152A', 154A' which are laterally separate from polycide gate 119' and laterally adjacent to dielectric spacers 134', 134' and also passes impurities into second portion 152B', 154B' which are located at the edges of channel 150'. (The profile of the p-type VT implant is shown as $VT_{pc}$). The VT implant does not pass impurity ions through mask 170. After the VT implant, mask 170 is stripped and a mask 172 is formed over p-channel device $P_C$, resulting in the structure shown in FIG. 9b.

Using a first n-type implant, n-type source/drain regions 130', 132' are formed. The first n-type implant does not pass through dielectric spacers 134", 136", or polycide gate 119". The structure is then subjected to an n-type VT implant. The VT implant passes impurities through dielectric spacers 134", 136", through insulating layer 114', through n-type source/drain regions 126', 128', 130' and 132' and into portions of p-type halo regions 120', 122. In particular, the VT implant passes impurities into first portions 120A', 122A' which are laterally separate from polycide gate 119" and laterally adjacent to dielectric spacers 134", 136" and also passes impurities into second portions 120B', 122B' which are located at the edges of channel 112'. (The profile of the n-type VT implant is shown as $VT_{NC}$). The VT implant does not pass impurities through polycide gate 119", or mask 172. Fabrication continues using conventional methods to form the desired device, for example a CMOS device.

The p-type and n-type VT implants use source/drain masks 170, 172, which are formed during fabrication of p-type source/drain regions 160', 162' and n-type source/drain regions 130', 132', respectively. Thus, both p-type and n-type VT implants are performed without adding a single masking step compared to the prior art process. Similarly, CMOS devices are formed using only a single p-type or n-type VT implant (where only the p-channel or n-channel device receives the VT implant) without adding a single masking step compared to the prior art process.

In alternative embodiments, unilateral MOSFETs are formed using the VT implant in accordance with the present invention. In unilateral MOSFETs, portions of the source region are contained within a halo region whereas portions of the drain region are not contained within a halo region. For example, unilateral MOSFETs are formed by forming the structures shown in FIGS. 2 and 8 without halo regions 122 and 154, respectively. Similarly, unilateral MOSFETs are formed by forming the structure shown in FIGS. 9a and 9b without halo regions 120' and 154'. In all other aspects, the methods for fabricating the unilateral MOSFETs are identical to the VT implant methods discussed in reference to FIGS. 2, 8, 9a and 9b.

In alternative embodiments, a VT implant is used to fabricate p-channel and n-channel devices having polysilicon gates. However, since polysilicon has a higher permeability to implanted ions than the material used to form the dielectric spacers, the polysilicon gates must be thicker, by approximately 500 to 1000 angstroms, than the thickness of the dielectric spacers. Polysilicon gates having a greater thickness than the dielectric spacers are illustrated by the dashed lines 119A in FIGS. 5, 8. For example, this can be accomplished by overetching the dielectric spacers during the dielectric spacer etch step.

By forming polysilicon gates that are thicker than the dielectric spacers, the VT implant, which passes through the dielectric spacers, does not pass through the polysilicon gates and enter into the underlying channel region.

The following example illustrates some advantages of forming CMOS devices using halo and VT implants in accordance with the present invention. Typically, for a 0.4 µm CMOS device, the threshold voltages of n-channel and p-channel devices are 0.7 volts (v) and −0.7 v, respectively. Using a conventional halo implant on the n-channel device, the p-well dopant concentration can be reduced by approximately 40% without the loss of the critical dimension margin. However, the threshold voltages remain the same, 0.7 v and −0.7 v for n-channel and p-channel devices, respectively, due to the edge effect associated with halo implants. Furthermore, the junction capacitance increases which slows down the device.

Figure 1A:
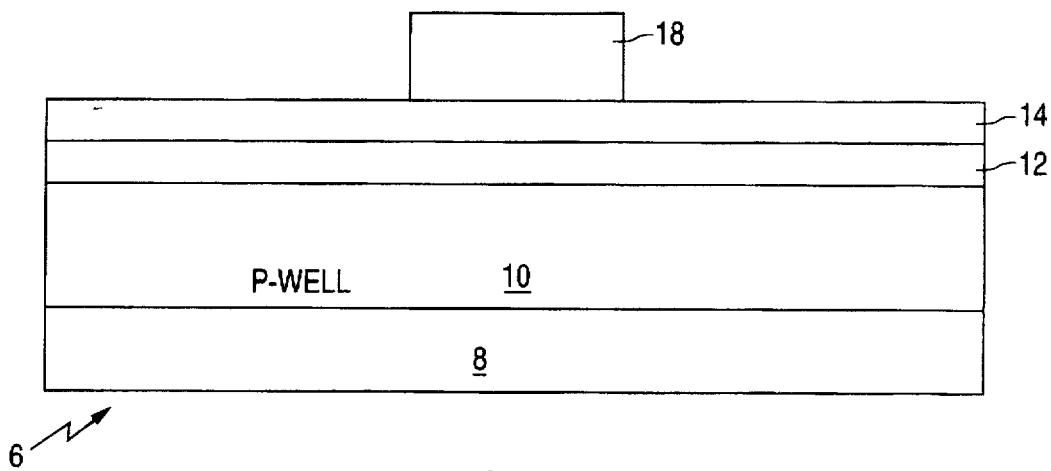
FIGS. 1a to 1d are cross-sectional views of an n-channel insulated gate field effect transistor during various fabrications steps in accordance with a prior art fabrication method.
Figure 1B:
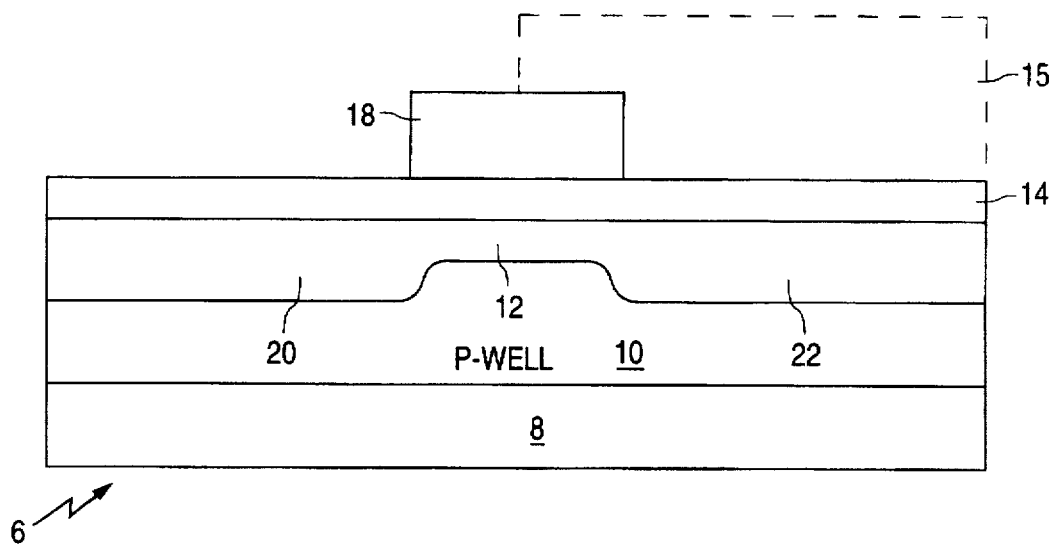
Figure 1C:
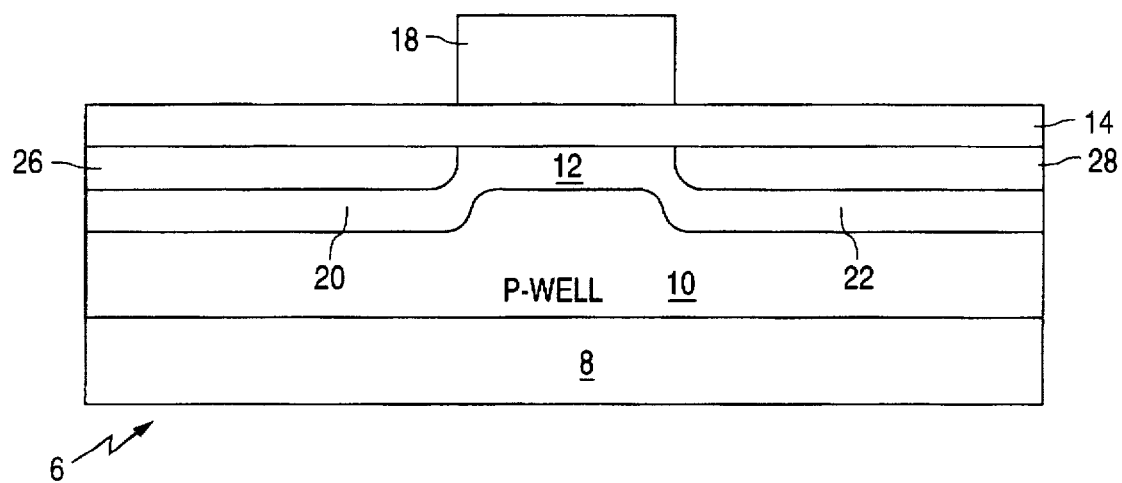
Figure 1D:
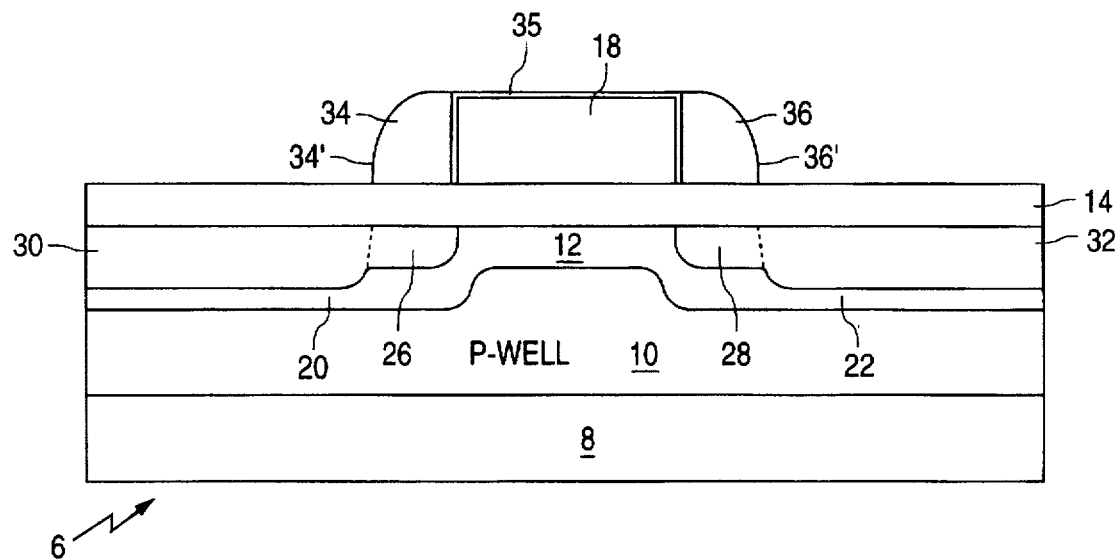

By adding a VT implant to the n-channel device which receives the halo implant, the n-channel associated threshold voltage is reduced to 0.5 v. By changing the dose of the conventional channel threshold voltage implant (the implant which dopes the channel, see doped layer 12 in FIG. 1a, for example) the threshold voltage for both n-channel and p-channel devices can be adjusted to 0.6 v and −0.6 v, respectively. Alternatively, the gate oxide can be made thicker, by approximately 10 to 20 angstroms, to obtain the original threshold voltage values of 0.7 v and −0.7 v for n-channel and p-channel devices, respectively. Increasing the thickness of the gate oxide increases the integrity of the gate oxide. Furthermore, by adding the VT implant, the junction capacitance of the n-channel device is reduced by approximately 15%, to a value similar to the original non-halo n-channel device and the punchthrough voltage is maintained.

As those skilled in the art will understand, the VT implant energy and dosage are based on factors such as the desired threshold voltage, junction capacitance and punchthrough voltage.

Although the present invention has been described with reference to preferred embodiments, workers skilled in the art will recognize that changes may be made in form and detail without departing from the spirit and scope of the invention. For example, in the foregoing description of the source/drain regions, halo regions and well regions, representative concentrations of dopants are set forth. However, the invention is not limited to such concentrations of dopants.

Having thus described the principles of the invention, together with several illustrative embodiments thereof, it is to be understood that, although specific terms are employed, they are used in a generic and descriptive sense, and not for purposes of limitation, the scope of the invention being set forth in the following claims.

We claim:

1. A semiconductor device having a substrate with a gate structure formed over said substrate, said gate structure having a first side connected to a first spacer, said semiconductor device comprising:

a first source/drain region and a channel region in said substrate, said channel region being directly laterally adjacent said first source/drain region and underlying said gate structure; and a first halo region in said substrate, said first halo region comprising a first halo portion, a second halo portion and a third halo portion, said first halo portion underlying said first spacer and having a first dopant concentration, said second halo portion being in said channel region and having a second dopant concentration less than said first dopant concentration, said third halo portion being laterally separate from said gate structure and laterally adjacent to said first spacer and having a third dopant concentration less than said first dopant concentration.

2. The semiconductor device of claim 1 wherein said first source/drain region is formed within said first halo region.

3. The semiconductor device of claim 1 wherein said first dopant concentration determines a punchthrough voltage of said semiconductor device, said second dopant concentration determines a threshold voltage of said semiconductor device and said third dopant concentration determines a junction capacitance of said semiconductor device.

4. The semiconductor device of claim 2 wherein said first source/drain region has a first portion underlying said first spacer and a second portion laterally adjacent said first spacer.

5. The semiconductor device of claim 4 wherein said first portion of said first source/drain region has a lower dopant concentration than said second portion of said first source/drain region.

6. The semiconductor device of claim 2 wherein said first halo region has a first conductivity type and said first source/drain region has a second conductivity type opposite said first conductivity type.

7. The semiconductor device of claim 1 wherein said second dopant concentration of said second halo portion is approximately equal to a dopant concentration of said channel region.

8. The semiconductor device of claim 1 further comprising an insulating layer over said substrate, wherein said gate structure is over said insulating layer.

9. The semiconductor device of claim 1 wherein said gate structure comprises a polycide gate.

10. A semiconductor device having a substrate with a gate structure formed over said substrate, said gate structure having a first side connected to a first spacer, said semiconductor device comprising:

a first source/drain region and a channel region in said substrate, said channel region being directly laterally adjacent said first source/drain region and underlying said gate structure; and a first halo region in said substrate, said first halo region comprising a first halo portion and a second halo portion, said first halo portion underlying said first spacer and having a first dopant concentration, said second halo portion being in said channel region and having a second dopant concentration less than said first dopant concentration, wherein said gate structure comprises a polysilicon gate having a greater thickness than said first spacer.

11. The semiconductor device of claim 10 wherein said polysilicon gate is approximately 500 to 1000 angstroms thicker than said first spacer.

12. The semiconductor device of claim 1 further comprising a second halo region in said substrate, said second halo region being discontinuous from said first halo region.

13. The semiconductor device of claim 12 wherein said gate structure has a second side connected to a second spacer and wherein said second halo region comprises a fourth halo portion and a fifth halo portion, said fourth halo portion underlying said second spacer, said fifth halo portion being in said channel region.

14. A semiconductor device having a substrate with a gate structure formed over said substrate, said gate structure having a first side connected to a first spacer, said semiconductor device comprising:

a first source/drain region and a channel region in said substrate, said channel region being directly laterally adjacent said first source/drain region and underlying said gate structure;

a first halo region in said substrate, said first halo region comprising a first halo portion and a second halo portion, said first halo portion underlying said first spacer and having a first dopant concentration, said second halo portion being in said channel region and having a second dopant concentration less than said first dopant concentration; and a second halo region in said substrate, said second halo region being discontinuous from said first halo region, wherein said gate structure has a second side connected to a second spacer and wherein said second halo region comprises a fourth halo portion, a fifth halo portion and a sixth halo portion, said fourth halo portion underlying said second spacer, said fifth halo portion being in said channel region, said sixth halo portion laterally separate from said gate structure and laterally adjacent to said second spacer.

15. The semiconductor device of claim 13 wherein said fourth halo portion has said first dopant concentration and said fifth halo portion has said second dopant concentration.

16. A semiconductor device having a substrate with a gate structure formed over said substrate, said gate structure having a side connected to a spacer, said semiconductor device comprising:
- a source/drain region and a channel region in said substrate, said channel region being directly laterally adjacent said source/drain region and underlying said gate structure; and
- a halo region in said substrate, said halo region comprising a first halo portion and a second halo portion, said first halo portion underlying said spacer and having a first conductivity type, said second halo portion being in said channel region and having a second conductivity type opposite said first conductivity type.

17. The semiconductor device of claim 16 wherein said halo region further comprises a third halo portion laterally separate from said gate structure and laterally adjacent to said spacer, said third halo portion having said first conductivity type.

18. The semiconductor device of claim 17 wherein said third halo portion has a dopant concentration less than said first halo portion.

19. The semiconductor device of claim 16 wherein said source/drain region has said second conductivity type.

20. The semiconductor device of claim 19 wherein said source/drain region comprises a first portion underlying said spacer and a second portion laterally adjacent said spacer, said second portion of said source/drain region having a higher dopant concentration than said first portion of said source/drain region.

21. The semiconductor device of claim 20 wherein said second halo portion has a dopant concentration approximately equal to said dopant concentration of said first portion of said source/drain region.

* * * * *